(12) United States Patent
Maynard et al.

(10) Patent No.: US 10,930,606 B2
(45) Date of Patent: Feb. 23, 2021

(54) ELECTRONIC DEVICE COMPRISING A DISCRETE TRANSISTOR ASSEMBLED ON A PRINTED CIRCUIT BOARD

(71) Applicants: Commissariat à l'Energie Atomique et aux Energies Alternatives, Paris (FR); RENAULT S.A.S., Boulogne Billancourt (FR)

(72) Inventors: Xavier Maynard, Grenoble (FR); Thierry Boudet, Grenoble (FR); Sébastien Carcouet, Grenoble (FR); Serge Loudot, Villiers-le-Bacle (FR)

(73) Assignees: Commissariat à l'Energie Atomique et aux Energies Alternatives, Paris (FR); Renault S.A.S., Boulogne Billancourt (FR)

( * ) Notice: Subject to any disclaimer, the term of this patent is extended or adjusted under 35 U.S.C. 154(b) by 0 days.

(21) Appl. No.: 16/449,405

(22) Filed: Jun. 23, 2019

(65) Prior Publication Data

US 2019/0393174 A1 Dec. 26, 2019

(30) Foreign Application Priority Data

Jun. 25, 2018 (FR) ........................ 1855665

(51) Int. Cl.
*H01L 23/00* (2006.01)
*H01L 23/31* (2006.01)
*H01L 23/498* (2006.01)

(52) U.S. Cl.
CPC .......... *H01L 24/08* (2013.01); *H01L 23/3121* (2013.01); *H01L 23/49811* (2013.01); *H01L 23/49866* (2013.01); *H01L 2224/08225* (2013.01); *H01L 2924/1033* (2013.01); *H01L 2924/10253* (2013.01); *H01L 2924/10272* (2013.01); *H01L 2924/13064* (2013.01); *H01L 2924/13091* (2013.01)

(58) Field of Classification Search
CPC ................. H01L 24/08; H01L 23/3121; H01L 23/49811; H01L 23/49866; H01L 2224/08225; H01L 2924/10253; H01L 2924/10272; H01L 2924/1033; H01L 2924/13064; H01L 2924/13091
USPC ........................................... 257/77
See application file for complete search history.

(56) References Cited

U.S. PATENT DOCUMENTS

| 2006/0113657 A1* | 6/2006 | Ejury ...................... H01L 23/50 257/691 |
| 2012/0236516 A1* | 9/2012 | Ishizaki ............... H05K 3/3436 361/752 |
| 2018/0054119 A1* | 2/2018 | Cho ....................... H02M 3/158 |

* cited by examiner

*Primary Examiner* — Tong-Ho Kim
(74) *Attorney, Agent, or Firm* — Moreno IP Law LLC

(57) ABSTRACT

An electronic device including: a discrete transistor including a semiconductor chip encapsulated in a package made of an insulating material leaving access to a first pad of connection to a first conduction terminal of the transistor; and a printed circuit board (320) including first (125) and second (129) separate connection pads, wherein the transistor is assembled on the printed circuit board so that the first connection pad (105) of the transistor is in contact with the first (125) and second (129) connection pads of the printed circuit board.

9 Claims, 3 Drawing Sheets

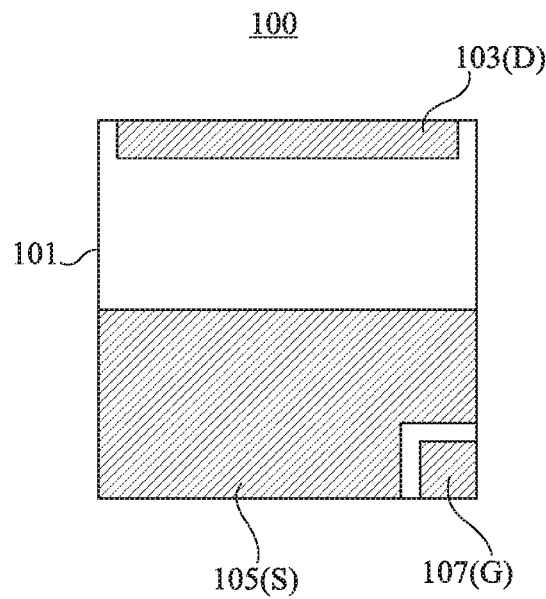
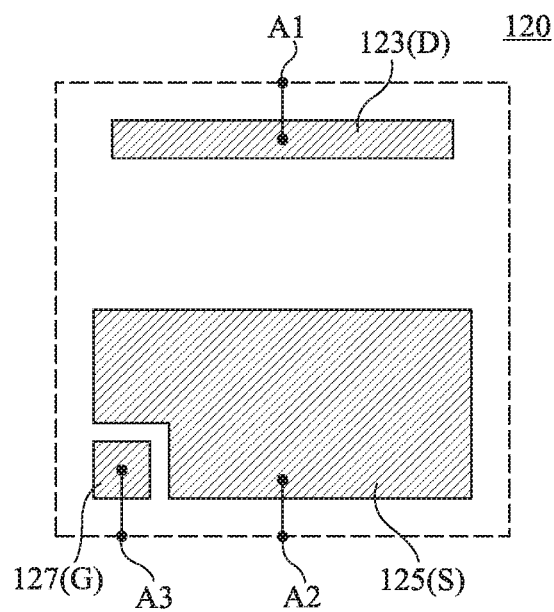
Fig 1A    Fig 1B
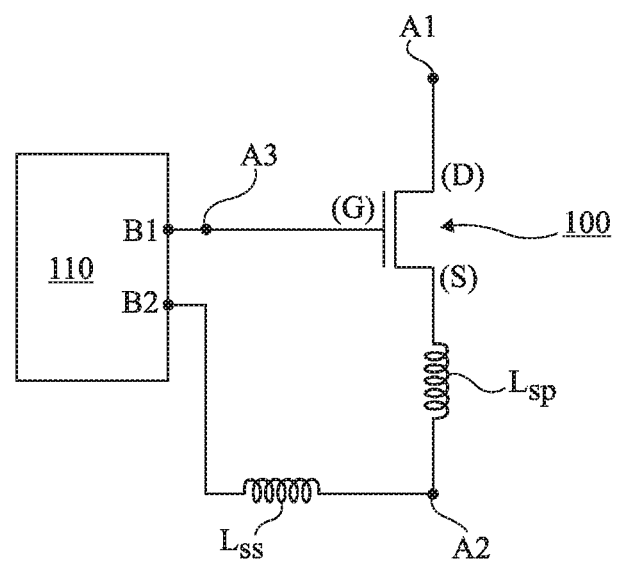
Fig 1C

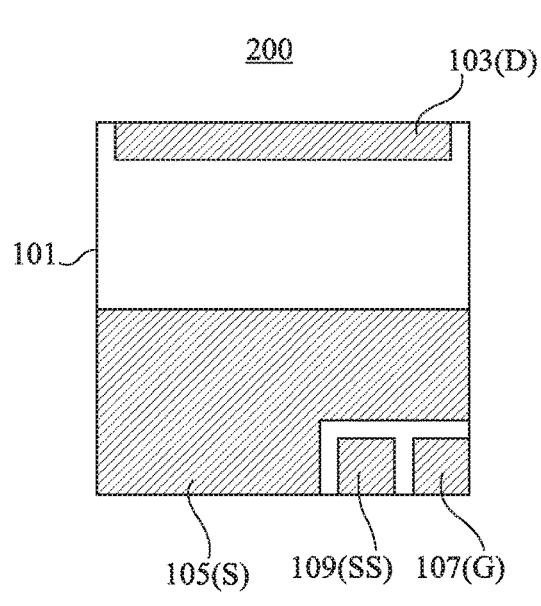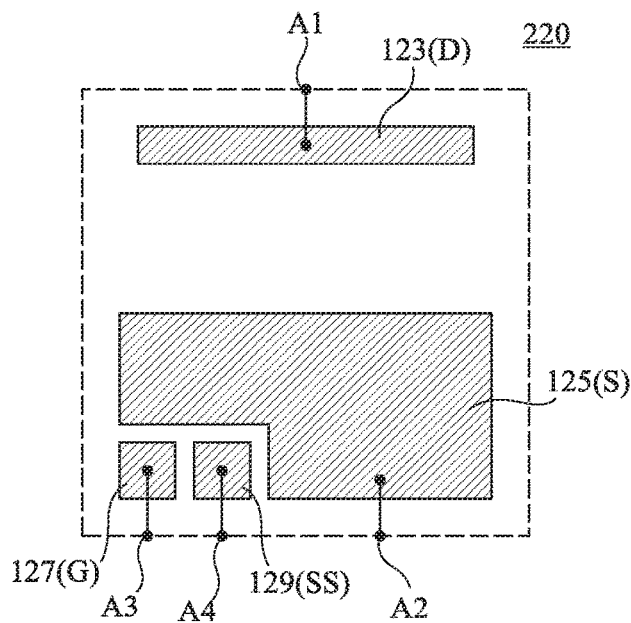
Fig 2A  Fig 2B
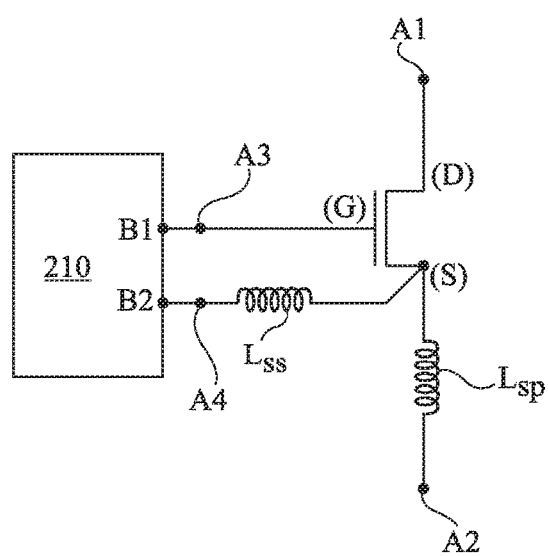
Fig 2C

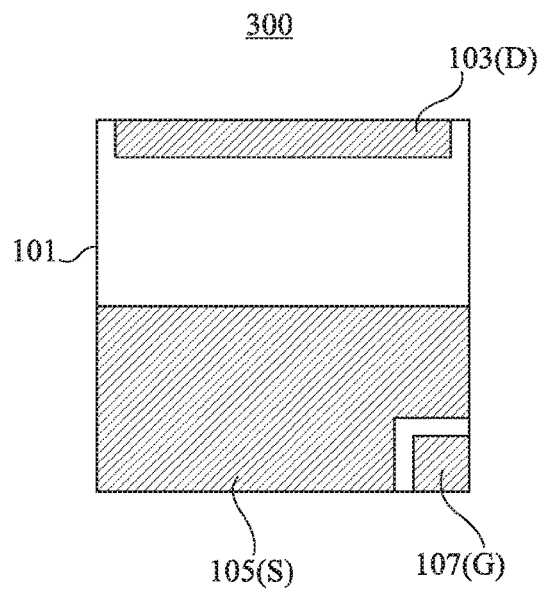
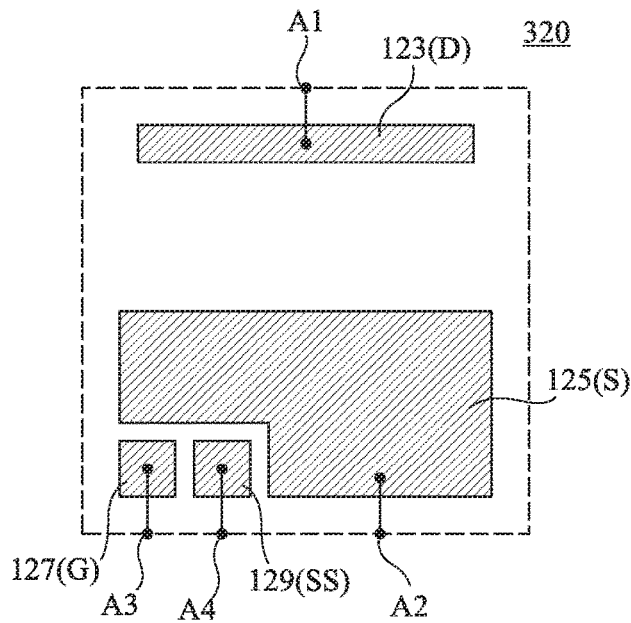
Fig 3A
Fig 3B
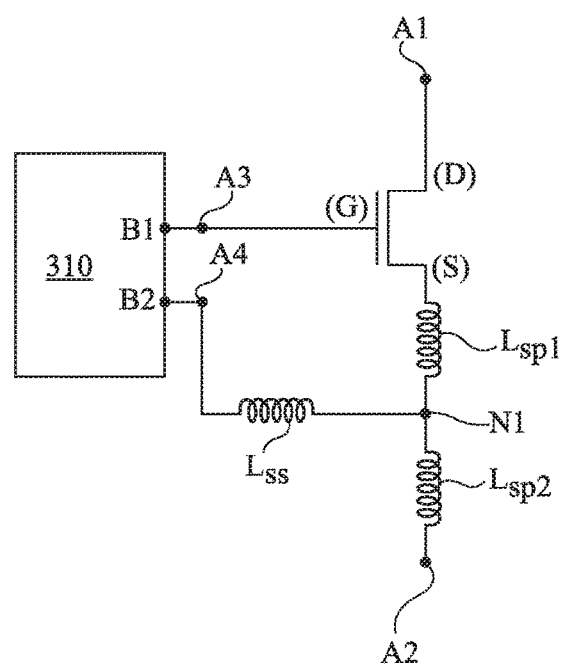
Fig 3C

ELECTRONIC DEVICE COMPRISING A DISCRETE TRANSISTOR ASSEMBLED ON A PRINTED CIRCUIT BOARD

FIELD

The present application concerns an electronic device, also called electronic board, comprising one or a plurality of discrete transistors assembled on a printed circuit board.

BACKGROUND

Many electronic devices comprising one or a plurality of discrete transistors assembled on a printed circuit board have already been provided. Power converters where one or a plurality of discrete transistors assembled on a printed circuit board are controlled in switched mode at a relatively high frequency, called switching frequency, for example, a frequency greater than 10 kHz, are here more particularly considered. In such a converter, it is desirable for the transistor switching speed (turn-off and turn-on speed) to be as high as possible. This indeed enables to increase the switching frequency of transistors, and accordingly to decrease the dimensions of one or a plurality of passive components (inductance(s) and/or capacitor(s)) of the converter, while maintaining the converter losses at a relatively low level. In practice, the transistor switching speed is however limited, particularly due to the parasitic inductances of the connection conductors coupling the transistor to a transistor control circuit.

SUMMARY

Thus, an embodiment provides an electronic device comprising:

a discrete transistor comprising a semiconductor chip encapsulated in a package made of an insulating material leaving access to a first pad of connection to a first conduction terminal of the transistor; and a printed circuit board comprising first and second separate connection pads, wherein the transistor is assembled on the printed circuit board so that the first connection pad of the transistor is in contact with the first and second connection pads of the printed circuit board.

According to an embodiment:

the transistor further comprises a second pad of connection to a second conduction terminal of the transistor, and a third pad of connection to a control terminal of the transistor;

the printed circuit board further comprises third and fourth connection pads; and the transistor is assembled on the printed circuit board so that the second and third connection pads of the transistor are respectively in contact with the third and fourth connection pads of the printed circuit board.

According to an embodiment, the device further comprises, assembled on the printed circuit board, a transistor control circuit, connected to the control terminal of the transistor via the fourth connection pad of the printed circuit board and to the first conduction terminal of the transistor via the second connection pad of the printed circuit board.

According to an embodiment, the control circuit is configured to alternately switch the transistor to the off state and to the on state at a frequency greater than 10 kHz.

According to an embodiment, in top view, the distance between the second connection pad of the printed circuit board and the fourth connection pad of the printed circuit board is shorter than one tenth of the largest dimension of the transistor.

According to an embodiment:

the printed circuit board further comprises a fifth connection pad separate from the first and second connection pads of the printed circuit board; and the transistor is assembled on the printed circuit board so that the first connection pad of the transistor is in contact with the first, second, and fifth connection pads of the printed circuit board.

According to an embodiment, the connection pads are made of metal.

According to an embodiment, the connection pads are made of copper.

According to an embodiment, the transistor is a MOS transistor, the first conduction terminal being a source terminal of the transistor.

According to an embodiment, the second conduction terminal and the control terminal are respectively a drain terminal and a gate terminal of the transistor.

According to an embodiment, the transistor is a gallium nitride transistor, a silicon carbide MOS transistor, or a silicon superjunction MOS transistor.

BRIEF DESCRIPTION OF THE DRAWINGS

The foregoing and other features and advantages will be discussed in detail in the following non-limiting description of specific embodiments in connection with the accompanying drawings, in which:

FIG. 1A is a simplified bottom view of an example of a discrete transistor;

FIG. 1B is a partial simplified top view of an example of a printed circuit board intended to receive the transistor of FIG. 1A;

FIG. 1C is an equivalent electric diagram of an electronic device comprising the transistor of FIG. 1A and a circuit of control of the transistor, assembled on the printed circuit board of FIG. 1B;

FIG. 2A is a simplified bottom view of another example of a discrete transistor;

FIG. 2B is a partial simplified top view of an example of a printed circuit board intended to receive the transistor of FIG. 2A;

FIG. 2C is an equivalent electric diagram of an electronic device comprising the transistor of FIG. 2A and a circuit of control of the transistor, assembled on the printed circuit board of FIG. 2B;

FIG. 3A is a simplified bottom view of an example of a discrete transistor of an electronic device according to an embodiment;

FIG. 3B is a partial simplified top view of an example of a printed circuit board of an electronic device according to an embodiment, intended to receive the transistor of FIG. 3A; and FIG. 3C is an equivalent electric diagram of an electronic device according to an embodiment, comprising the transistor of FIG. 3A and a circuit of control of the transistor, assembled on the printed circuit board of FIG. 3B.

DETAILED DESCRIPTION OF THE PRESENT EMBODIMENTS

The same elements have been designated with the same reference numerals in the various drawings and, further, the various drawings are not to scale. For clarity, only those steps and elements which are useful to the understanding of the described embodiments have been shown and are detailed. In particular, the internal structure of the transistors of the described electronic devices has not been detailed, the described embodiments being compatible with all or most of known discrete transistor structures. Further, the complete electric diagrams of the described electronic devices have not been detailed, the described embodiments being compatible with all or most of the electronic devices comprising discrete transistors, and in particular discrete transistors controlled in switched mode, for example, switched-mode converters.

It should be noted that discrete transistor here means a transistor formed inside and on top of a semiconductor chip independent from the other components of the device. Such a transistor may further comprise an encapsulation package, for example, made of an insulating material, leaving access to at least three conductive pads of connection to an external device, respectively connected to the two conduction terminals of the transistor (the source and the drain in the case of a MOS transistor or in the case of a HEMT (High Electron Mobility Transistor), for example, a gallium nitride (GaN) HEMT), and to a control terminal of the transistor (the gate in the case of a MOS transistor or in the case of a GaN HEMT). Although the described embodiments are not limited to this specific case, power transistors, that is, transistors capable of holding relatively high voltages in the off state (non-conductive), for example, voltages greater than or equal to 100 V and preferably greater than or equal to 500 V, and/or of conducting relatively high currents in the on state (conductive), for example, currents greater than or equal to 1 A, and preferably greater than or equal to 10 A, are here more particularly considered.

Further, printed circuit board or PCB here means a plate-shaped support enabling to hold and to electrically couple to one another a plurality of discrete electronic components, to form a complex electronic device also called electronic board. A printed circuit board is for example formed of a stack of a support layer made of an insulating material, and of one or a plurality of conductive layers, for example, made of copper, separated from one another by an insulating material. The conductive layers are locally etched, for example, by a chemical process, to define an assembly of conductive connection pads to which corresponding conductive connection pads of the device components are intended to be welded or soldered, and an assembly of conductive tracks coupling to one another the connection pads of the printed circuit board.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1A is a simplified bottom view of an example of a discrete transistor 100.

Transistor 100 comprises a semiconductor chip (not shown in FIG. 1A) having the active portion of the transistor formed inside and on top of it. In this example, the semiconductor chip is encapsulated in a package 101 made of an insulating material, for example, made of resin, leaving access to only three pads 103, 105, and 107 of connection of the transistor to an external device. Pads 103, 105, and 107 are for example made of metal, for example, copper. In this example, transistor 100 is a GaN HEMT or a MOS transistor, pads 103, 105, and 107 being respectively connected, inside of package 101, to the drain, to the source, and to the gate of the transistor. In this example, package 101 has a parallelepipedal general shape, all the pads of connection of the transistor being arranged on the lower surface side of the transistor (the visible surface in FIG. 1A).

FIG. 1B is a partial simplified top view of an example of a printed circuit board 120 intended to receive transistor 100 of FIG. 1A. Printed circuit board 120 comprises, on its upper surface side, three connection pads 123, 125, and 127, for example, made of metal, for example, copper, intended to be respectively connected to the three connection pads 103, 105, and 107 of transistor 100. In this example, pads 123, 125, and 127 of printed circuit board 120 have, in front view, substantially the same shape and the same dimensions as, respectively, pads 103, 105, and 107 of transistor 100. In this example, transistor 100 and printed circuit board 120 are intended to be assembled by surface mounting. In other words, the lower surface of each of the connection pads 103, 105, and 107 of the transistor is bonded and electrically connected, for example, by welding or by soldering, to the upper surface of the corresponding connection pad 123, respectively 125, respectively 127, of printed circuit board 120.

Printed circuit board 120 may further comprise conductive tracks (not detailed in FIG. 1B), coupling connection pads 123, 125, and 127 to pads of connection to other discrete components of the device or to external connection terminals of the device. For simplification, FIG. 1B simply schematically shows a terminal A1 of printed circuit board 120, having pad 123 (corresponding to the transistor drain) connected thereto, a terminal A2 of printed circuit board 120, having pad 125 (corresponding to the transistor source) connected thereto, and a terminal A3 of printed circuit board 120, having pad 127 (corresponding to the transistor gate) connected thereto. In use, transistor 100 has the function of modulating or of switching a current flowing between terminals A1 and A2 of the device. For this purpose, the device comprises a circuit (not shown in FIG. 1B) of control of transistor 100, also assembled on printed circuit board 120 and connected between terminals A3 and A2 of the device. More particularly, in the case of a GaN HEMT or of a MOS transistor, the control circuit applies a control voltage between the gate (via terminal A3) and the source (via terminal A2) of the transistor to control the current flowing between the conduction terminals (drain and source) of the transistor.

FIG. 1C is an equivalent electric diagram of an electronic device comprising transistor 100 of FIG. 1A and a circuit 110 of control of the transistor, assembled on printed circuit board 120 of FIG. 1B. Control circuit 110 comprises a first terminal B1 connected to terminal A3 (itself connected to the gate of transistor 100) and a second terminal B2 connected to terminal A2 (itself connected to the source of transistor 100). FIG. 1C shows a first inductance $L_{sp}$, coupling the source (S) of transistor 100 to terminal A2, and a second inductance $L_{ss}$ coupling terminal A2 to terminal B2 of control circuit 110. Inductance $L_{sp}$ corresponds to the parasitic inductance of all the conductors coupling the source (S) of transistor 100 to terminal A2, that is, connection pad 105 of the transistor, the corresponding connection pad 125 of the printed circuit board, and the conductive track(s) coupling pad 125 to terminal A2. Inductance Lss corresponds to the parasitic inductance of all the conductors (not detailed in the drawings) coupling terminal A2 of the device to terminal B2 of the control circuit.

Although parasitic inductances $L_{sp}$ and $L_{ss}$ are very low, the latter may disturb the gate-source voltage effectively seen by the transistor. In particular, in operation, inductance $L_{sp}$ is capable of conducting significant currents since is it located on the main power path of the transistor. During switchings to the off state or to the on state of the transistor, a fast variation of the current flowing through inductance $L_{sp}$ occurs, which may generate a relatively high voltage across inductance $L_{sp}$. As an example, for a switching of a 50-A current in a 5-ns switching period, the current variation speed in inductance $L_{sp}$ is 50 kA/µs. Considering an inductance $L_{sp}$ of 1 nH (which corresponds to a conductive track length in the order of 1 mm on a printed circuit board), the voltage across inductance $L_{sp}$ during the switching period may reach 10 V. Thus, the control terminal effectively seen by the transistor is strongly influenced by parasitic inductance $L_{sp}$, which may cause malfunctions, or even a breakdown of the transistor.

Inductance $L_{ss}$ is less disturbing since the currents that it conducts are in practice negligible with respect to the current flowing through inductance $L_{sp}$.

A solution to limit the malfunctions discussed hereabove is to limit the transistor switching speed. As indicated hereabove, in a switched-mode converter, this implies a decrease in the cut-off frequency and accordingly an increase in the dimensions of the passive components of the converter, as well as an increase in switching losses.

FIG. 2A is a simplified bottom view of another example of a discrete transistor 200. Transistor 200 comprises the same elements as transistor 100 of FIG. 1A, arranged substantially in the same way, and further comprises an additional pad 109 of connection to an external device. In the shown example, pad 109 is arranged on the same surface of package 101 as pads 103, 105, and 107, that is, the lower surface of the package. Pad 109 is for example made of the same conductive material as pads 103, 105, and 107. Inside of package 101, pad 109 is connected to the source region of the transistor. As an example, inside of the package, pad 109 (SS) is connected to the same source terminal as pad 105. As seen from the outside, pad 109 is however laterally insulated from pad 105 by the insulating material of package 101. Pad 109 forms a source control pad, intended to be connected to the control circuit of the transistor, while pad 105 forms a conductive source pad, intended to be connected on the power path of the device.

FIG. 2B is a partial simplified top view of an example of a printed circuit board 220 intended to receive transistor 200 of FIG. 2A. Printed circuit board 220 comprises, on its upper surface side, four connection pads 123, 125, 127, and 129, for example, made of metal, for example, of copper, intended to be respectively connected to the four connection pads 103, 105, 107, and 109 of transistor 200. In this example, pads 123, 125, 127, and 129 of printed circuit board 220 have, in front view, substantially the same shape and the same dimensions as, respectively, pads 103, 105, 107, and 109 of transistor 200. In this example, pads 129 and 125 are separate, that is, in the absence of transistor 200 (before the assembly of transistor 200 on the printed circuit board), pads 129 and 125 are electrically insulated from each other.

In this example, transistor 200 and printed circuit board 220 are intended to be assembled by surface mounting. In other words, the lower surface of each of the connection pads 103, 105, 107, and 109 of the transistor is bonded and electrically connected, for example, by welding or by soldering, to the upper surface of the corresponding connection pad 123, respectively 125, respectively 127, respectively 129 of printed circuit board 220.

Printed circuit board 220 may further comprise conductive tracks (not detailed in FIG. 2B), coupling connection pads 123, 125, 127, and 129 to pads of connection to other discrete components of the device or to external connection terminals of the device. For simplification, FIG. 2B schematically shows a terminal A1 of printed circuit board 220, having pad 123 connected thereto, a terminal A2 of printed circuit board 220, having pad 125 connected thereto, a terminal A3 of printed circuit board 220, having pad 127 connected thereto, and a terminal A4 of printed circuit board 220, having pad 129 connected thereto. In use, transistor 200 has the function of modulating or of switching a current flowing between terminals A1 and A2 of the device. For this purpose, the device comprises a circuit (not shown in FIG. 2B) of control of transistor 200, also assembled on printed circuit board 220, connected between terminals A3 and A4 of the device. More particularly, in the case of a GaN HEMT or of a MOS transistor, the control circuit applies a control voltage between the gate (via terminal A3) and the source (via terminal A4) of the transistor to control the current flowing between conductive terminals A1 (drain) and A2 (source) of the device.

FIG. 2C is an equivalent electric diagram of an electronic device comprising transistor 200 of FIG. 2A and a circuit 210 of control of the transistor, assembled on printed circuit board 220 of FIG. 2B. Control circuit 210 comprises a first terminal B1 connected to terminal A3 (itself connected to the gate of transistor 200), and a second terminal B2 connected to terminal A4 (itself connected to the source of transistor 200). FIG. 2C shows a first inductance $L_{sp}$, coupling the source (S) of transistor 200 to terminal A2, and a second inductance $L_{ss}$ coupling the source (S) of transistor 200 to terminal B2 of control circuit 210. Inductance $L_{sp}$ corresponds to the parasitic inductance of the assembly of the conductors coupling the source (S) of transistor 200 to terminal A2, that is, the connection pad 105 of the transistor, the corresponding connection pad 125 of the printed circuit board, and the conductive track(s) coupling pad 125 to terminal A2. Inductance $L_{ss}$ corresponds to the parasitic inductance of the assembly of conductors coupling source (S) of transistor 200 to terminal B2, that is, the connection pad 109 of the transistor, the corresponding connection pad 129 of the printed circuit board, and the conductive track(s) coupling pad 129 to terminal A4 (as well as, possibly, the conductive track(s) coupling terminal A4 to terminal B2, having a parasitic inductance considered as negligible in the shown example).

As illustrated in the diagram of FIG. 2C, the provision, in transistor 200, of a source control pad 109 separated from conduction source pad 105 and, on printed circuit board 220, of a corresponding source control pad 129 separate from conduction source pad 125, enables to make the source connection parasitic inductance seen both by control circuit 210 and by the power path of the device negligible.

In the configuration of FIGS. 2A, 2B, and 2C, inductance $L_{sp}$ is always likely to conduct significant currents, which may, as explained hereabove in relation with FIG. 1C, result in the occurrence of a relatively high voltage thereacross during switchings of the transistor. However, unlike the configuration of FIGS. 1A, 1B, and 1C, this does not disturb the control voltage effectively seen by the transistor, since inductance $L_{sp}$ is outside of the connection path between terminal B2 of the control circuit and the source of the transistor.

As in the configuration of FIGS. 1A, 1B, and 1C, inductance $L_{ss}$ is little disturbing since the currents that it conducts are negligible with respect to the current crossing inductance $L_{sp}$.

Thus, the configuration of FIGS. 2A, 2B, and 2C enables to apply to the transistor a higher switching speed than in the configuration of FIGS. 1A, 1B, and 1C, without increasing risks of malfunction.

However, a disadvantage of such a solution is that it requires using specific discrete transistors, provided with an additional control pad (pad 109 in the example of FIG. 2A), which are not always available in the catalogs of semiconductor component manufacturers.

FIGS. 3A, 3B, and 3C schematically illustrate an embodiment of an electronic device comprising a discrete transistor 300 assembled on a printed circuit board 320. FIGS. 3A and 3B respectively are a bottom view of transistor 300 and a top view of printed circuit board 320, and FIG. 3C is an equivalent electric diagram of the device.

In this example, transistor 300 is identical or similar to transistor 100 of FIG. 1A. In particular, in this example, transistor 300 comprises a single pad 105 of connection to the source (S) of the transistor accessible outside of package 101.

Printed circuit board 320 is identical or similar to printed circuit board 220 of FIG. 2B. More particularly, in this example, printed circuit board 320 comprises two separate source connection pads 125 and 129. Pad 125 forms a conduction source pad of the device and pad 129 forms a source control pad of the device.

In the example of FIGS. 3A, 3B, and 3C, pads 125 and 129 are intended, on assembly of transistor 300, to be both connected to source connection pad 105 of the transistor.

In other words, on assembly of transistor 300, the lower surface of source connection pad 105 of transistor 300 is bonded and electrically connected, for example, by welding or by soldering, both to the upper surface of pad 125 and to the upper surface of pad 129.

Similarly to what has been described in the example of FIGS. 2A, 2B, and 2C, pads 125 and 129 are electrically insulated from each other in the absence of transistor 300 (before the assembly of the transistor on the printed circuit board).

Preferably, source control pad 129 is close to the gate connection pad 127 of the printed circuit board, that is, it is laterally separated from pad 127 only by the insulating material of the printed circuit board, rather than by another conductor of the printed circuit board. As an example, in top view, the distance between pad 127 and pad 129 is smaller than one tenth of the largest dimension of transistor 300.

Printed circuit board 320 may further comprise conductive tracks (not detailed in FIG. 3B), coupling connection pads 123, 125, 127, and 129 to pads of connection to other discrete components of the device or to external connection terminals of the device. For simplification, FIG. 3B schematically shows a terminal A1 of printed circuit board 320, having pad 123 connected thereto, a terminal A2 of printed circuit board 320, having pad 125 connected thereto, a terminal A3 of printed circuit board 320, having pad 127 connected thereto, and a terminal A4 of printed circuit board 320, having pad 129 connected thereto.

In use, transistor 300 has the function of modulating or switching a current flowing between terminals A1 and A2 of the device. To achieve this, the device comprises a circuit (not shown in FIG. 3B) of control of transistor 300, also assembled on printed circuit board 320, connected between terminals A3 and A4 of the device. More particularly, in the case of a GaN HEMT or of a MOS transistor, the control circuit applies a control voltage between the gate (via terminal A3) and the source (via terminal A4) of the transistor to control the current flowing between conductive terminals A1 (drain) and A2 (source) of the device.

FIG. 3C is an equivalent electric diagram of an electronic device comprising transistor 300 of FIG. 3A and a circuit 310 of control of the transistor, assembled on printed circuit board 320 of FIG. 3B. Control circuit 310 comprises a first terminal B1 connected to terminal A3 (itself connected to the gate of transistor 300), and a second terminal B2 connected to terminal A4 (itself connected to the source of transistor 300). FIG. 3C shows a series association of a first inductance $L_{sp1}$ and of a second inductance $L_{sp2}$, coupling the source (S) of transistor 300 to terminal A2, and a third inductance $L_{ss}$ coupling junction point N1 of inductances $L_{sp1}$ and $L_{sp2}$ to terminal B2 of control circuit 310. Inductance $L_{sp1}$ corresponds to the parasitic inductance of the assembly of conductors coupling the source (S) of transistor 300 both to pad 125 and to pad 129 of printed circuit board 320, that is, the connection pad 105 of transistor 300 in this example. Inductance $L_{sp2}$ corresponds to the parasitic inductance of the assembly of conductors coupling the connection pad 105 of transistor 300 to terminal A2, that is, the connection pad 125 of the printed circuit board, and the conductive track(s) coupling pad 125 to terminal A2. Inductance $L_{ss}$ corresponds to the parasitic inductance of the assembly of conductors coupling the connection pad 105 of transistor 200 to terminal B2, that is, the connection pad 129 of the printed circuit board, and the conductive track(s) coupling pad 129 to terminal A4 (as well as possibly the conductive track(s) coupling terminal A4 to terminal B2, having a parasitic inductance considered as negligible in the shown example).

An advantage of the embodiment described in relation with FIGS. 3A, 3B, and 3C is that it enables to use a discrete transistor comprising a single source connection pad accessible outside of the transistor package and, with a simple transformation of the conductive pattern of the printed circuit board, to create a source control pad separate from the conduction source pad, to significantly decrease the parasitic source connection inductance seen both by the transistor control circuit and by the power path of the device. This enables, as compared with the configuration of FIGS. 1A, 1B, and 1C, to increase the switching speed of the transistor without increasing risks of malfunction (without for all this using a component provided with an additional control pad as in the example of FIGS. 2A, 2B, and 2C).

Specific embodiments have been described. Various alterations and modifications will occur to those skilled in the art. In particular, embodiments applied to GaN HEMTs or to MOS transistors have been described hereabove. The embodiments are however not limited to these specific cases. More generally, the described embodiments may be applied to any transistor comprising two conduction terminals and one control terminal intended to receive an electric control signal referenced with respect to one of the conduction terminals, for example, bipolar transistors or field-effect transistors. The described embodiments are particularly adapted to fast-switching transistors. In addition to the above-mentioned examples, the described embodiments are particularly advantageous for silicon carbide MOS transistors or for silicon superjunction MO S transistors.

Further, the described embodiments are not limited to the above-mentioned application to switched-mode power converters, and may more generally apply to any electronic device comprising a discrete transistor assembled on a printed circuit board.

An embodiment where a single source control pad 129 is provided on the printed circuit board has been shown in FIGS. 3A and 3B. As a variation, a plurality of separate source control pads, intended to be connected to the same source connection pad 105 of the transistor as conduction source pad 125, may be provided on the printed circuit board. As an example, two separate source control pads arranged on either side of conduction source pad 125 may be provided on the printed circuit board. The different source control pads of the printed circuit board may be connected to different control circuits, or to a same control circuit.

What is claimed is:

1. An electronic device comprising:
    a discrete transistor comprising a semiconductor chip encapsulated in a package made of an insulating material leaving access to a first pad of connection to a first conduction terminal of the transistor, a second pad of connection to a second conduction terminal of the transistor, and a third pad of connection to a control terminal of the transistor; and
    a printed circuit board comprising first, second, third, and fourth separate connection pads,
    wherein the transistor is assembled on the printed circuit board so that the first pad of connection of the transistor is in contact with the first and second connection pads of the printed circuit board and that the second and third pads of connection of the transistor are respectively in contact with the third and fourth connection pads of the printed circuit board;
    the device further comprises, assembled on the printed circuit board, a circuit of control of the transistor, connected to the control terminal of the transistor via the fourth connection pad of the printed circuit board and to the first conduction terminal of the transistor via the second connection pad of the printed circuit board; and
    the first connection pad of the printed circuit board is connected to a power terminal of the electronic device.

2. The device of claim 1, wherein the circuit of control is configured to alternately switch the transistor to the off state and to the on state at a frequency greater than 10 kHz.

3. The device of claim 1, wherein, in top view, a distance between the second connection pad of the printed circuit board and the fourth connection pad of the printed circuit board is shorter than one tenth of a largest dimensions of the transistor.

4. The device of claim 1, wherein:
    the printed circuit board further comprises a fifth connection pad separate from the first and second connection pads of the printed circuit board; and
    the transistor is assembled on the printed circuit board so that the first pad of connection of the transistor is in contact with the first, second, and fifth connection pads of the printed circuit board.

5. The device of claim 1, wherein the first, second, third, and fourth connection pads are made of metal.

6. The device of claim 1, wherein the first, second, third, and fourth connection pads are made of copper.

7. The device of claim 1, wherein the transistor is a MOS transistor, the first conduction terminal being a source terminal of the transistor.

8. The device of claim 1, wherein the transistor is a MOS transistor, the first conduction terminal being a source terminal of the transistor, and wherein the second conduction terminal and the control terminal are respectively a drain terminal and a gate terminal of the transistor.

9. The device of claim 1, wherein the transistor is a gallium nitride transistor, a silicon carbide MOS transistor, or a silicon superjunction MOS transistor.

* * * * *